(12) United States Patent
Ling et al.

(10) Patent No.: US 12,266,623 B2
(45) Date of Patent: Apr. 1, 2025

(54) SUBSTRATE BONDING METHOD (71) Applicant: Shenzhen Xiuyuan Electronic Technology Co., Ltd., Shenzhen (CN)

(72) Inventors: Yunzhi Ling, Guangzhou (CN); Siliang He, Guangzhou (CN); Jianguo Ma, Guangzhou (CN); Yuhao Bi, Guangzhou (CN); Xingyu Liu, Guangzhou (CN); Chuan Hu, Guangzhou (CN); Zhitao Chen, Guangzhou (CN)

(73) Assignee: Shenzhen Xiuyuan Electronic Technology Co., Ltd., Shenzhen (CN)

( * ) Notice: Subject to any disclaimer, the term of this patent is extended or adjusted under 35 U.S.C. 154(b) by 418 days.

(21) Appl. No.: 17/918,038

(22) PCT Filed: Jul. 28, 2022

(86) PCT No.: PCT/CN2022/108718
§ 371 (c)(1),
(2) Date: Oct. 10, 2022

(87) PCT Pub. No.: WO2024/020954
PCT Pub. Date: Feb. 1, 2024

(65) Prior Publication Data
US 2024/0038705 A1 Feb. 1, 2024

(51) Int. Cl.
H01L 23/00 (2006.01)
H01R 4/58 (2006.01)
H01R 43/00 (2006.01)

(52) U.S. Cl.
CPC .............. *H01L 24/13* (2013.01); *H01L 24/03* (2013.01); *H01L 24/05* (2013.01); *H01L 24/11* (2013.01); *H01L 24/16* (2013.01); *H01L 24/29* (2013.01); *H01L 24/32* (2013.01); *H01L 24/73* (2013.01); *H01L 24/81* (2013.01); *H01L 24/83* (2013.01);
(Continued)

(58) Field of Classification Search
CPC .......... H01L 24/13; H01L 24/29; H01L 24/93
See application file for complete search history.

(56) References Cited

U.S. PATENT DOCUMENTS

| 10,224,286 B1* | 3/2019 | England | H01L 24/05 |
| 10,293,693 B2* | 5/2019 | Kim | H02J 7/0068 |

* cited by examiner

*Primary Examiner* — Dale E Page
*Assistant Examiner* — Wilner Jean Baptiste
(74) *Attorney, Agent, or Firm* — Dicke Billig & Czaja, PLLC (57) ABSTRACT

A substrate bonding method includes: providing a first and a second substrate; forming, on the first substrate, a first metal micro-bump array including first metal pillar(s) formed on the first substrate and first metal nanowires formed thereon and spaced apart from each other; forming, on the second substrate, a second metal micro-bump array including second metal pillar(s) formed on the second substrate and second metal nanowires formed thereon and spaced apart from each other; pressing the first substrate onto the second substrate, such that the first and second metal micro-bump arrays are positioned and staggered with each other, forming a physically interwoven interlocking structure between the first and second metal nanowires; applying a filling material between the first and second substrates; curing the filling material to form a bonding cavity; and then performing confined heating reflux on the first and second metal micro-bump arrays in the bonding cavity.

20 Claims, 6 Drawing Sheets (52) U.S. Cl.
CPC ............... *H01L 24/92* (2013.01); *H01R 4/58* (2013.01); *H01R 43/00* (2013.01); *H01L 2224/0345* (2013.01); *H01L 2224/05573* (2013.01); *H01L 2224/1146* (2013.01); *H01L 2224/13016* (2013.01); *H01L 2224/13082* (2013.01); *H01L 2224/13109* (2013.01); *H01L 2224/13111* (2013.01); *H01L 2224/13147* (2013.01); *H01L 2224/16057* (2013.01); *H01L 2224/2919* (2013.01); *H01L 2224/321* (2013.01); *H01L 2224/73204* (2013.01); *H01L 2224/81201* (2013.01); *H01L 2224/81898* (2013.01); *H01L 2224/81948* (2013.01); *H01L 2224/83102* (2013.01); *H01L 2224/83855* (2013.01); *H01L 2224/9205* (2013.01); *H01L 2924/0665* (2013.01); *H01L 2924/20104* (2013.01); *H01L 2924/20105* (2013.01); *H01L 2924/20106* (2013.01); *H01L 2924/20107* (2013.01); *H01L 2924/20108* (2013.01)

SUBSTRATE BONDING METHOD

CROSS-REFERENCE TO RELATED APPLICATION

This Utility Patent Application claims priority under 35 U.S.C. § 371 to International Application Serial No. PCT/CN2022/108718, filed Jul. 28, 2022, which is incorporated herein by reference in its entirety.

TECHNICAL FIELD

The present disclosure generally relates to the technical field of semiconductor packaging. More specifically, the present disclosure relates to a substrate bonding method.

BACKGROUND ART

This section provides background information related to the present disclosure, but the information does not necessarily constitute the prior art.

As more and more transistors are accommodated on integrated circuit, the number of interconnection is increasing, while their size is getting smaller and smaller, which brings challenges to existing packaging and interconnecting technologies. In recent years, in order to achieve high-density packaging and interconnection, packaging and interconnecting technologies based on micro-bumps are brought into use in Flip Chip, wafer-level packaging, and 2.5D/3D packaging. Compared with the traditional wire bonding technology, the packaging and interconnecting technologies based on micro-bumps realize a shorter interconnection path and a higher packaging density.

In related packaging and interconnecting technologies based on micro-bumps, micro copper pillars, for example, are generally respectively formed on an upper substrate and a lower substrate, and the bonding of the upper substrate and the lower substrate is performed subsequently through heating reflux or a hot-pressing process. However, in the current packaging and interconnecting technologies, it is usually impossible to directly bond the micro copper pillars of the upper substrate and the micro copper pillars of the lower substrate together, and it is required to form a tin cap on the top of the micro copper pillars. Therefore, tin-cap-based copper-copper bonding interconnections (Cu—Sn—Cu flip-chip bonding) are currently the main way to achieve integrated interconnections in 3D packaging.

It has been noticed by the inventors of the present disclosure that the tin-cap-based copper-copper bonding interconnection technology has certain problems in actual processes, causing reduced reliability of the packaging and interconnection. For example, when tin is melted during heating reflux, since the content of tin is usually limited, the interfacial intermetallic compound (IMC) formed during the heating reflux often cannot be formed into ideal $Cu_6Sn_5$ as desired, instead of that, is possibly formed into brittle $Cu_3Sn$. In other words, heating reflux may cause embrittlement of interfacial intermetallic compounds, resulting in the reduction in the bonding reliability. In addition, during the hot-pressing process, tin might be extruded out of the interconnection interface under pressure, and in a situation where tin overflows due to excessive extrusion, the risk of bonding short-circuit is greatly increased. Moreover, the excessive pressure present in the hot-pressing process may also cause splintering of thinned wafers.

Therefore, there is a need to provide a substrate bonding method capable of realizing reliable packaging and interconnection.

SUMMARY

This section provides a general summary of the present disclosure, rather than a comprehensive disclosure of the full scope or all the features of the present disclosure.

An embodiment of the present disclosure provides a substrate bonding method, wherein the substrate bonding method may comprise: providing a first substrate and a second substrate; forming a first metal micro-bump array on the first substrate, wherein the first metal micro-bump array comprises at least one first metal pillar formed on the first substrate and a plurality of first metal nanowires formed on the first metal pillar and spaced apart from each other; forming a second metal micro-bump array on the second substrate, wherein the second metal micro-bump array comprises at least one second metal pillar formed on the second substrate and a plurality of second metal nanowires formed on the second metal pillar and spaced apart from each other; pressing the first substrate onto the second substrate, such that the first metal micro-bump array and the second metal micro-bump array are positioned in a manner of being staggered with each other, hereby forming a physically interwoven interlocking structure between the first metal nanowires and the second metal nanowires; applying a filling material between the first substrate and the second substrate; curing the filling material to form a bonding cavity; and performing heating confinement reflux on the first metal micro-bump array and the second metal micro-bump array in the bonding cavity, after the filling material is cured, so as to realize bonding of the first substrate and the second substrate.

In some optional embodiments, the first metal micro-bump array and the second metal micro-bump array may be made of at least one material from copper, tin, and indium; and the first metal micro-bump array may be formed of a material same as or different from the material which the second metal micro-bump array is formed of.

In some optional embodiments, the step of applying a filling material between the first substrate and the second substrate may comprise: applying the filling material to an interspace (gap) formed between the first substrate and the second substrate, after the first substrate is pressed onto the second substrate.

In some optional embodiments, the filling material may be applied onto the second substrate prior to pressing the first substrate onto the second substrate; and the filling material may be filled in the interspace between the first substrate and the second substrate by pressing the first substrate onto the second substrate.

In some optional embodiments, the step of forming a first metal micro-bump array on the first substrate may comprise: sputtering a first seed layer on the first substrate; coating a first photoresist layer on the first seed layer; patterning the first photoresist layer, and exposing the first photoresist layer at a position where the first metal micro-bump array is to be formed; hot-pressing a first porous membrane layer on the first photoresist layer, wherein the first porous membrane layer is configured to be used as a growth template for the first metal nanowires; forming the first metal pillar and the first metal nanowires on the first seed layer by way of plating at a position where the first photoresist layer is exposed, such that the growth height of the first metal nanowires is lower than the height of the first porous membrane layer; and removing the first porous membrane layer, the first photoresist layer, and the exposed part of the first seed layer, after the first metal pillar and the first metal nanowires are formed.

In some optional embodiments, the first porous membrane layer may be a porous polycarbonate membrane layer or a porous anodized aluminum oxide membrane layer. In some optional embodiments, the step of removing the first porous membrane layer, the first photoresist layer, and the exposed part of the first seed layer may comprise: immersing the first substrate in a dichloromethane solution to dissolve the first porous membrane layer; immersing the first substrate in an acetone solution to dissolve the first photoresist layer; and removing the exposed part of the first seed layer by grinding.

In some optional embodiments, the step of forming a second metal micro-bump array on the second substrate may comprise: sputtering a second seed layer on the second substrate; coating a second photoresist layer on the second seed layer; patterning the second photoresist layer, and exposing the second photoresist layer at a position where the second metal micro-bump array is to be formed; hot-pressing a second porous membrane layer on the second photoresist layer, wherein the second porous membrane layer is configured to be used as a growth template for the second metal nanowires; forming the second metal pillar and the second metal nanowires on the second seed layer by way of plating at a position where the second photoresist layer is exposed, such that the growth height of the second metal nanowires is lower than the height of the second porous membrane layer; and removing the second porous membrane layer, the second photoresist layer, and the exposed part of the second seed layer.

In some optional embodiments, the second porous membrane layer may be a porous polycarbonate membrane layer or a porous anodized aluminum oxide membrane layer. In some optional embodiments, the step of removing the second porous membrane layer, the second photoresist layer, and the exposed part of the second seed layer may comprise: immersing the second substrate in a dichloromethane solution to dissolve the second porous membrane layer; immersing the second substrate in an acetone solution to dissolve the second photoresist layer; and removing the exposed part of the second seed layer by grinding.

In some optional embodiments, the substrate bonding method may further comprise: performing surface treatment on the first metal micro-bump array and the second metal micro-bump array prior to performing the heating reflux on the first metal micro-bump array and the second metal micro-bump array.

In some optional embodiments, the step of performing surface treatment on the first metal micro-bump array and the second metal micro-bump array may comprise: applying a soldering flux onto the surfaces of the first metal micro-bump array and the second metal micro-bump array; and/or removing oxides on the surfaces of the first metal micro-bump array and the second metal micro-bump array by using formic acid reduction, hydrogen gas reduction, and plasma deoxidation.

In some optional embodiments, the substrate bonding method may further comprise: performing surface treatment on the first metal micro-bump array and the second metal micro-bump array prior to pressing the first substrate onto the second substrate, so as to remove oxides on the surfaces of the first metal micro-bump array and the second metal micro-bump array; and placing the first substrate and the second substrate in a vacuum environment, or placing the first substrate and the second substrate in an atmosphere environment capable of preventing the first metal micro-bump array and the second metal micro-bump array from being oxidized, while the first substrate is being pressed towards the second substrate and after the first substrate is pressed onto the second substrate.

In some optional embodiments, the filling material may be an epoxy resin.

In some optional embodiments, the filling material may be cured within a temperature range between 100° C. and 300° C.

In some optional embodiments, the first metal micro-bump array and the second metal micro-bump array may be subjected to heating flux within a temperature range between 100° C. and 300° C.

In some optional embodiments, the first metal pillar and the second metal pillar may have a height ranging from 0.1 to 50 microns, and may have a diameter ranging from 0.5 to 200 microns; and the first metal nanowires and the second metal nanowires may have a height ranging from 0.1 to 50 microns, and may have a diameter ranging from 0.01 to 5 microns.

According to the substrate bonding method provided in the embodiments of the present disclosure, the attach-pressing and interlocking of the first substrate and the second substrate are realized by pressing the first substrate onto the second substrate. During the attach-pressing and interlocking processes, a physically interwoven interlocking structure is formed between the first metal nanowires and the second metal nanowires, hereby obtaining a relatively strong interlocking strength between the first substrate and the second substrate, and such an interlocking strength formed by physical interweaving makes sure that: no any displacement would be caused between an upper substrate and a lower substrate when adding a filling material. In addition, since the filling material cannot saturate the interlocking network formed by the interlocking structure, a bonding cavity will be formed after the filling material is cured, wherein the first metal micro-bump array and the second metal micro-bump will be enclosed in the bonding cavity. In this way, when the first metal micro-bump array and the second metal micro-bump array are subjected to heating reflux, because of the capillary effect, melted metal materials will only be able to flow in the bonding cavity in a confined manner, and cannot overflow. Therefore, possible risks of bonding short-circuit caused by overflowing metal materials are avoided. Moreover, during the liquidizing process of the metal materials of the first metal micro-bump array and the second metal micro-bump array, alignment bonding has the self-alignment effect, therefore, the alignment accuracy can be improved, the bonding reliability is improved, and the bonding temperature is reduced. Thus, according to the embodiments of the present disclosure, a novel interconnecting method for low-temperature bonding of metal micro-bumps by attach-pressing-interlocking-filling-refluxing is provided.

BRIEF DESCRIPTION OF DRAWINGS

In order to more clearly illustrate the technical solution of the present disclosure, the drawings required to be used therein will be simply presented below; and it shall be understood that the following drawings merely show certain embodiments of the present disclosure, and thus should not be construed as limiting the scope thereof, and for a person ordinarily skilled in the art, further relevant drawings could also be obtained according to these drawings without using any creative efforts.

DETAILED DESCRIPTION OF EMBODIMENTS

The present disclosure will be described in detail below by means of exemplary embodiments with reference to the drawings. It shall be noticed that following detailed description of the present disclosure is intended merely for illustration, rather than limiting the present disclosure. In addition, same reference signs are used in respective drawings for representing same components.

It shall further be clarified that for clarity, not all the features of actual specific embodiments are described and shown in the description and in the drawings, and in order to avoid that unnecessary details blur the concerned technical solutions of the present disclosure, the drawings and the description merely describe and show device structures closely related to the technical solutions of the present disclosure, while other details being not so relevant in the technical contents of the present disclosure and known to a person skilled in the art are skipped.

Hereinafter, a substrate bonding method provided according to an exemplary embodiment of the present disclosure will firstly be described in detail with reference to FIGS. 1 and 2.

Figure 1:
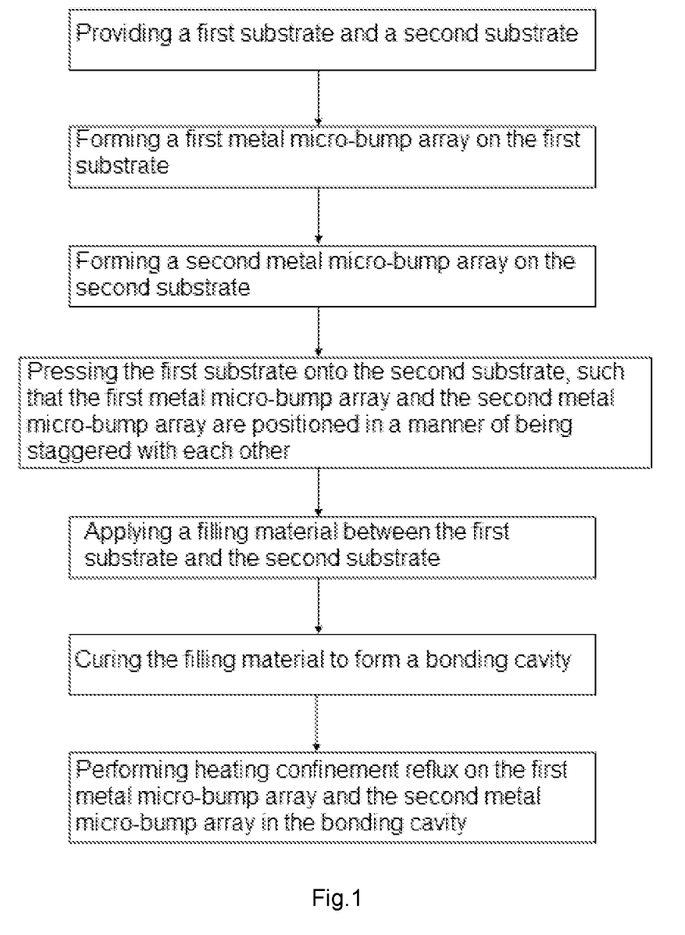
FIG. 1 is a schematic flow chart of a substrate bonding method according to an exemplary embodiment of the present disclosure.
Figure 2:
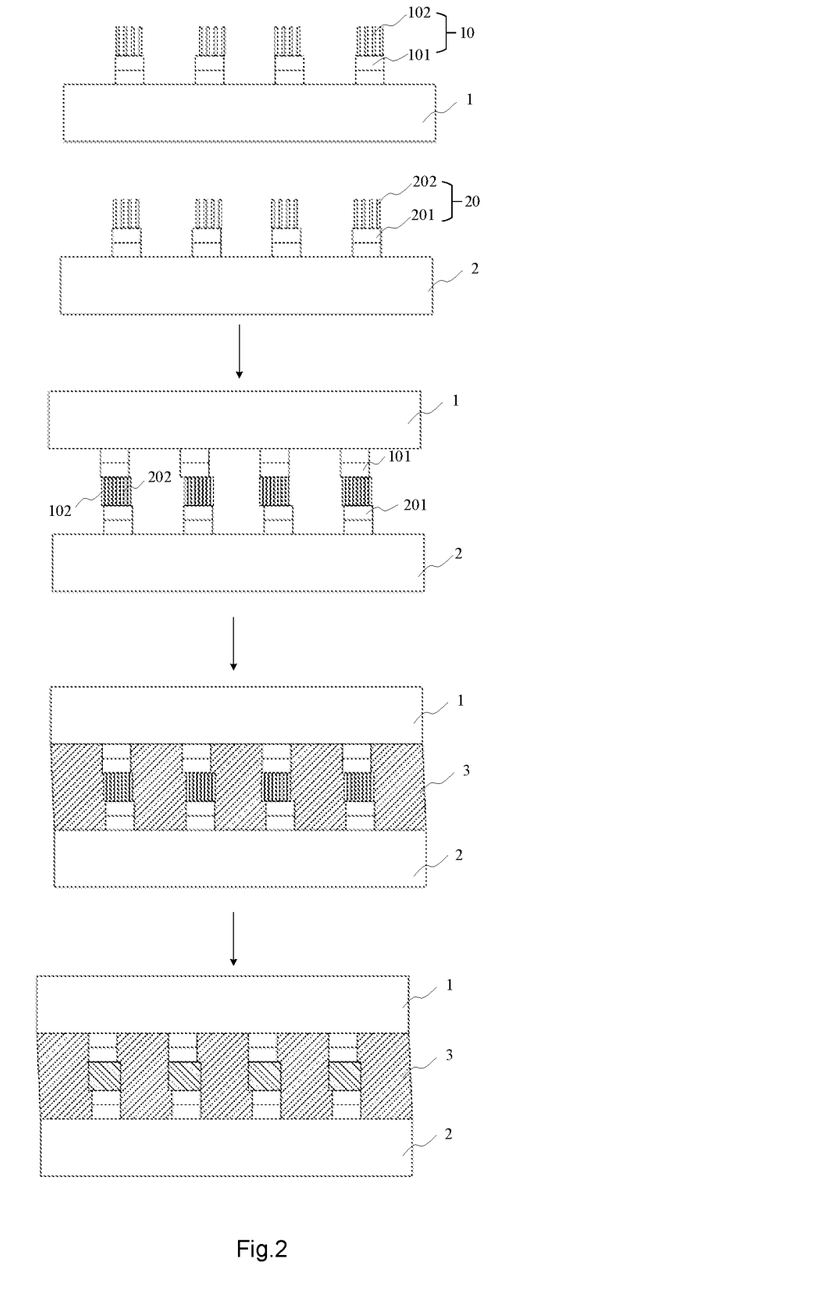
FIG. 2 is an illustrative structural schematic drawing of the substrate bonding method according to an exemplary embodiment of the present disclosure.

FIG. 1 is a schematic flow chart of a substrate bonding method according to an exemplary embodiment of the present disclosure. FIG. 2 is an illustrative structural schematic drawing of the substrate bonding method according to an exemplary embodiment of the present disclosure. Referring to FIGS. 1 and 2, according to an embodiment of the present disclosure, the substrate bonding method may comprise: providing a first substrate 1 and a second substrate 2; forming a first metal micro-bump array 10 on the first substrate 1, wherein the first metal micro-bump array 10 comprises at least one first metal pillar 101 formed on the first substrate 1 and a plurality of first metal nanowires 102 formed on the first metal pillar 101 and spaced apart from each other; forming a second metal micro-bump array 20 on the second substrate 2, wherein the second metal micro-bump array 20 comprises at least one second metal pillar 201 formed on the second substrate 2 and a plurality of second metal nanowires 202 formed on the second metal pillar 201 and spaced apart from each other; pressing the first substrate 1 onto the second substrate 2, such that the first metal micro-bump array 10 and the second metal micro-bump array 20 are positioned in a manner of being staggered with each other, hereby forming a physically interwoven interlocking structure between the first metal nanowires 102 and the second metal nanowires 202; applying a filling material 3 between the first substrate 1 and the second substrate 2; curing the filling material 3 to form a bonding cavity; and performing heating confinement reflux on the first metal micro-bump array 10 and the second metal micro-bump array 20 in the bonding cavity, after the filling material 3 is cured, so as to realize bonding of the first substrate 1 and the second substrate 2.

According to the substrate bonding method provided in the embodiments of the present disclosure, the attach-pressing and interlocking of the first substrate and the second substrate are realized by pressing the first substrate onto the second substrate. During the attach-pressing and interlocking process, a physically interwoven interlocking structure is formed between the first metal nanowires and the second metal nanowires, hereby obtaining a relatively strong interlocking strength between the first substrate and the second substrate, and such an interlocking strength formed by physical interweaving makes sure that: no any displacement would be caused between an upper substrate and a lower substrate when adding a filling material. In addition, since the filling material cannot saturate the interlocking network formed by the interlocking structure, a bonding cavity will be formed after the filling material is cured, wherein the first metal micro-bump array and the second metal micro-bump will be enclosed in the bonding cavity. In this way, when the first metal micro-bump array and the second metal micro-bump array are subjected to heating reflux, because of the capillary effect, melted metal materials will only be able to flow in the bonding cavity in a confined manner, and cannot overflow. Therefore, possible risks of bonding short-circuit caused by overflowing metal materials are avoided. Moreover, during the liquidizing process of the metal materials of the first metal micro-bump array and the second metal micro-bump array, alignment bonding has the self-alignment effect, therefore, the alignment accuracy can be improved, the bonding reliability is improved, and the bonding temperature is reduced. Thus, according to the embodiments of the present disclosure, a novel interconnecting method for low-temperature bonding of metal micro-bumps by attach-pressing-interlocking-filling-refluxing is provided.

In some embodiments, the first metal micro-bump array 10 and the second metal micro-bump array 20 may be made of at least one material from copper, tin, and indium. In addition, the first metal micro-bump array 10 may be formed of a material same as or different from the material which the second metal micro-bump array 20 is formed of.

In an optional embodiment, one of the first metal nanowire 102 of the first metal micro-bump array 10 and the second metal nanowire 202 of the second metal micro-bump array 20 may be made of copper, while the other one may be made of tin. It shall be understood that copper nanowires and tin nanowires, at the nanoscale, are more prone to generate intermetallic compounds with the highest thermodynamic stability. Thus, under this circumstance, when the first metal nanowires 102 and the second metal nanowires 202 are subjected to heating reflux, it is easier to generate intermetallic compounds, hereby significantly improving the reliability of bonding. In addition, the bonding of copper nanowires and tin nanowires can effectively expand the atomic diffusion rate at the bonding interface and reduce the bonding temperature. Therefore, there is almost no thermal stress during the heating reflux, hereby realizing a low-temperature micro-bump interconnecting structure having stable intermetallic compounds but no thermal stress and no tin extrusion.

It shall be pointed out that the material which the first metal micro-bump array 10 is formed of and the material which the second metal micro-bump array 20 is formed of may not be limited thereto, as long as the first metal micro-bump array 10 and the second metal micro-bump array 20 can realize reliable bonding of the first substrate 1 and the second substrate 2. In an optional embodiment, one of the first metal nanowire 102 of the first metal micro-bump array 10 and the second metal nanowire 202 of the second metal micro-bump array 20 may be made of copper, while the other one may be made of indium. In addition, in some embodiments, each of the first metal micro-bump array 10 and the second metal micro-bump array 20 may be made of copper, tin, or indium.

Moreover, it could be understood that the material which the first metal micro-bump array 10 is formed of and the material which the second metal micro-bump array 20 is formed of may not be limited to only one material. In an optional embodiment, at least one from the first metal pillar 101 of the first metal micro-bump array 10 and the second metal pillar 201 of the second metal micro-bump array 20 may be a block metal pillar formed by a copper pillar and a tin pillar. In addition, in some embodiments, at least one of the first metal nanowire 102 of the first metal micro-bump array 10 and the second metal nanowire 202 of the second metal micro-bump array 20 may be a block nanowire formed by a tin nanowire and an indium nanowire. Without departing from the spirit and the scope of the present disclosure, a person skilled in the art could conceive of any proper material or material combination for forming the first metal micro-bump array and the second metal micro-bump array of the present disclosure.

In some embodiments, the step of applying a filling material 3 between the first substrate 1 and the second substrate 2 may comprise: applying the filling material 3 to an interspace formed between the first substrate 1 and the second substrate 2, after the first substrate 1 is pressed onto the second substrate 2. It could be understood that a physically interwoven interlocking structure is formed between the first metal nanowires 102 and the second metal nanowires 202, after the first substrate 1 is pressed onto the second substrate 2, hereby obtaining a certain connecting strength between the first substrate 1 and the second substrate 2. In other words, after the first substrate 1 is pressed onto the second substrate 2, a pressure is maintained between the first substrate 1 and the second substrate 2. Under this circumstance, when the filling material 3 is applied to the interspace formed between the first substrate 1 and the second substrate 2, because of the capillary effect, the filling material 2 can fill up the interspace between the first substrate 1 and the second substrate 2.

It could be understood that in some embodiments, the filling material 3 may be applied onto the second substrate 2 prior to pressing the first substrate 1 onto the second substrate 2; and the filling material 3 may be filled in the interspace between the first substrate 1 and the second substrate 2 by pressing the first substrate 1 onto the second substrate 2. Under this circumstance, it is possible to add the filling material 3 onto the second substrate 2 in advance, and then press the first substrate 1 onto the second substrate 2. In this way, the filling material 3 may also fill up the interspace between the first substrate 1 and the second substrate 2.

According to the substrate bonding method provided in the embodiments of the present disclosure, the cured filling material can enclose the first metal micro-bump array and the second metal micro-bump array by filling the interspace between the first substrate and the second substrate with a filling material. Under this circumstance, when the first metal micro-bump array and the second metal micro-bump array are subjected to heating reflux, because of the enclosing effect of the cured filling material, the melted metal material will only be able to flow in the interlocking cavity of the interlocking structure formed by the first metal micro-bump array and the second metal micro-bump array, and cannot overflow, hereby improving the reliability of the substrate bonding.

In some embodiments, the filling material 3 may be an epoxy resin. It shall be understood that materials for the filling material 3 are not limited thereto, and may be any proper material, as long as it can realize the enclosing of the first metal micro-bump array and the second metal micro-bump array prior to the heating reflux. It shall be pointed out that the filling material 3 will only enclose the first metal micro-bump array 10 and the second metal micro-bump array 20, without filling possible interspaces in the interlocking structure formed by the first metal micro-bump array 10 and the second metal micro-bump array 20. In other words, the use of the filling material 3 can ensure that during the heating reflux, the melted metal material flows only in the interlocking cavity of the interlocking structure formed by the first metal micro-bump array 10 and the second metal micro-bump array 20, while the filling material 3 does not exert any adverse influence on the bonding of the first metal micro-bump array and the second metal micro-bump array 20 during the heating reflux.

Hereinafter, a mode for forming a first metal micro-bump array on a first substrate according to an exemplary embodiment of the present disclosure will be illustrated with reference to FIGS. 3 and 4.

Figure 3:
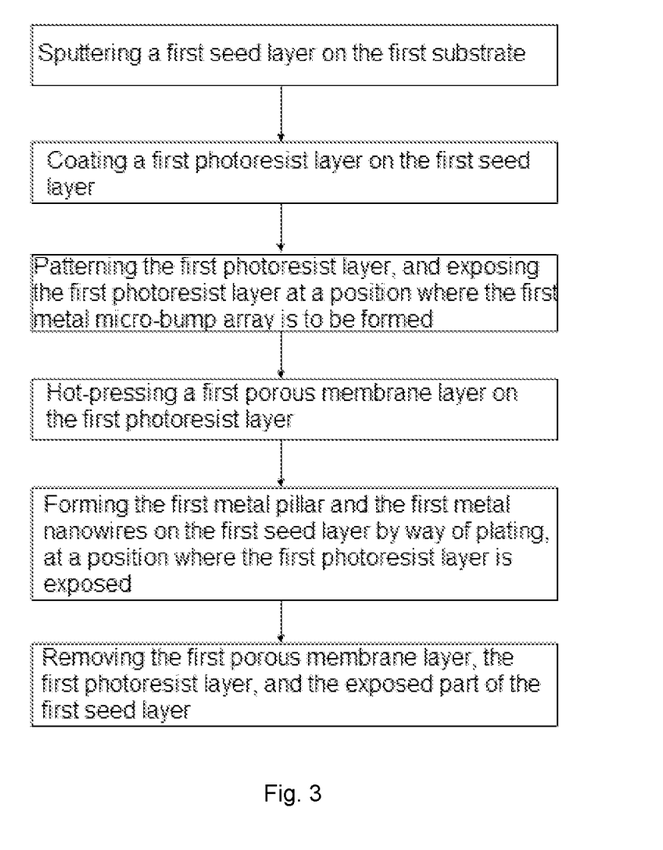
FIG. 3 is a schematic flow chart of a step of forming a first metal micro-bump array on a first substrate according to an exemplary embodiment of the present disclosure.
Figure 4:
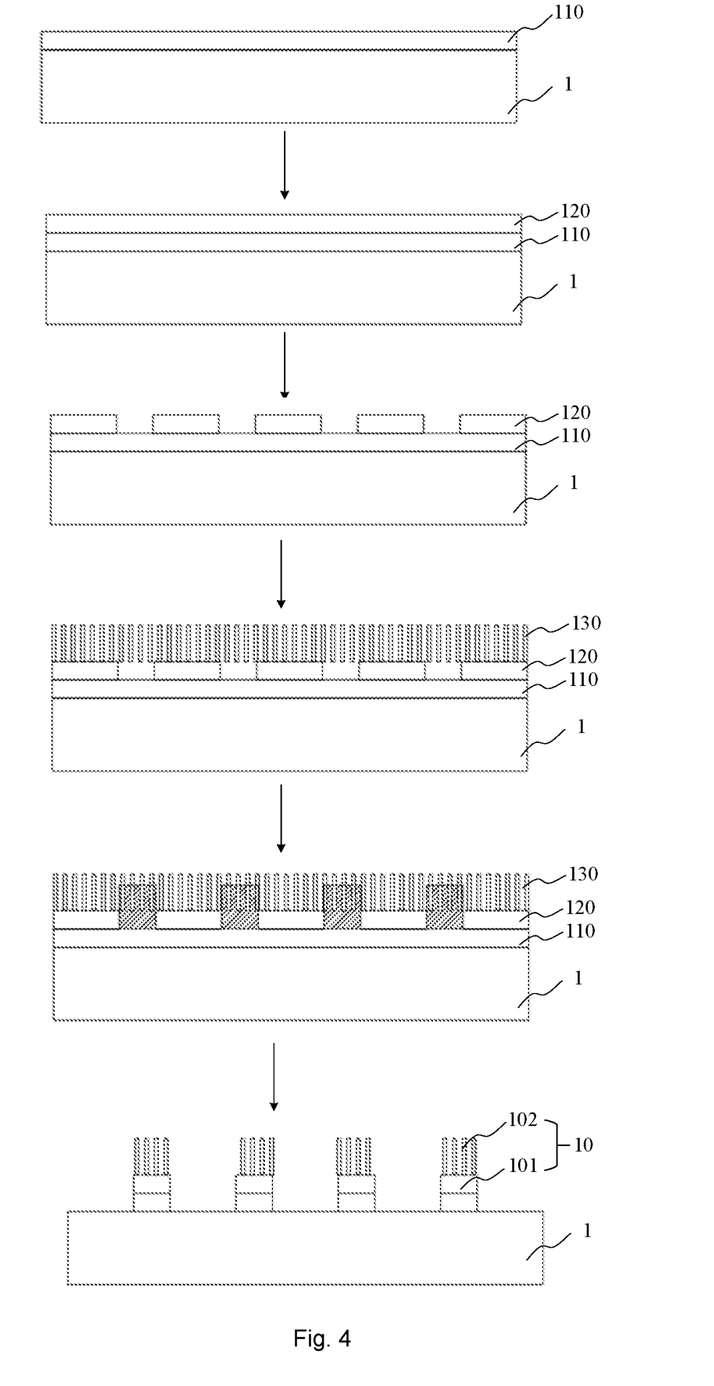
FIG. 4 is an illustrative structural schematic drawing of the step of forming a first metal micro-bump array on a first substrate according to an exemplary embodiment of the present disclosure.

FIG. 3 is a schematic flow chart of a step of forming a first metal micro-bump array on a first substrate according to an exemplary embodiment of the present disclosure; and FIG. 4 is an illustrative structural schematic drawing of the step of forming a first metal micro-bump array on a first substrate according to an exemplary embodiment of the present disclosure. Referring to FIGS. 3 and 4, in some embodiments, the step of forming a first metal micro-bump array 10 on the first substrate 1 may comprise: sputtering a first seed layer 110 on the first substrate 1; coating a first photoresist layer 120 on the first seed layer 110; patterning the first photoresist layer 120, and exposing the first photoresist layer at a position where the first metal micro-bump array to be formed; hot-pressing a first porous membrane layer 130 on the first photoresist layer 120, wherein the first porous membrane layer is constructed as a growth template for the first metal nanowires 102; forming the first metal pillar 101 and the first metal nanowires 102 on the first seed layer 110 by way of plating at a position where the first photoresist layer 120 is exposed, such that the growth height of the first metal nanowires 102 is lower than the height of the first porous membrane layer 130; and removing the first porous membrane layer 130, the first photoresist layer 120, and the exposed part of the first seed layer 110, after the first metal pillar 101 and the first metal nanowires 102 are formed.

In some embodiments, the growth region of the first metal micro-bump array may be obtained by removing the part of the first photoresist layer 120 with a developer. It could be understood that the graphics, the dimensions and/or the pitch of the first metal micro-bump array 10 may be specifically designed according to actual applications, hereby exposing specific region of the first photoresist layer 120 in a targeted way.

It shall be pointed out that the above-described mode for forming a first metal micro-bump array on a first substrate is intended merely for illustration, and without departing from the spirit of the present disclosure, a person skilled in the art could conceive of any proper mode for forming a first metal micro-bump array on a first substrate, which shall be deemed as falling within the scope of the present disclosure.

In some embodiments, the first porous membrane layer 130 may be a polycarbonate porous membrane layer of or an anodized aluminum oxide porous membrane layer. In addition, in some optional embodiments, the step of removing the first porous membrane layer 130, the first photoresist layer 120, and the exposed part of the first seed layer 110 may comprise: immersing the first substrate 1 in a dichloromethane solution to dissolve the first porous membrane layer 130; immersing the first substrate 1 in an acetone solution to dissolve the first photoresist layer 120; and removing the exposed part of the first seed layer 110 by grinding.

It could be understood that the above-mentioned material of the first porous membrane layer is not restrictive. Without departing from the spirit and the principle of the present disclosure, a person skilled in the art could select any proper material for forming the first porous membrane layer, as long as it can be used for the growth template of the first metal nanowires and can be removed after the first metal micro-bump array is formed. Moreover, the above mentioned mode for removing the first porous membrane layer, the first photoresist layer, and the exposed part of the first seed layer is also not restrictive, and without departing from the spirit of the present disclosure, a person skilled in the art could conceive of the use of any proper mode for removing the first porous membrane layer, the first photoresist layer, and the exposed part of the first seed layer, which shall be deemed as belonging to the scope of the present disclosure.

Hereinafter, a mode for forming a second metal micro-bump array on a second substrate according to an exemplary embodiment of the present disclosure will be illustrated with reference to FIGS. 5 and 6.

Figure 5:
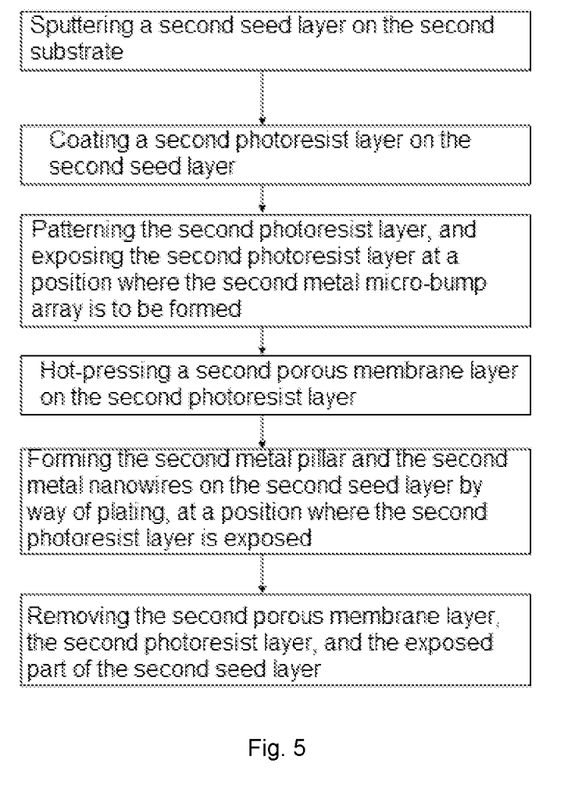
FIG. 5 is a schematic flow chart of a step of forming a second metal micro-bump array on a second substrate according to an exemplary embodiment of the present disclosure.
Figure 6:
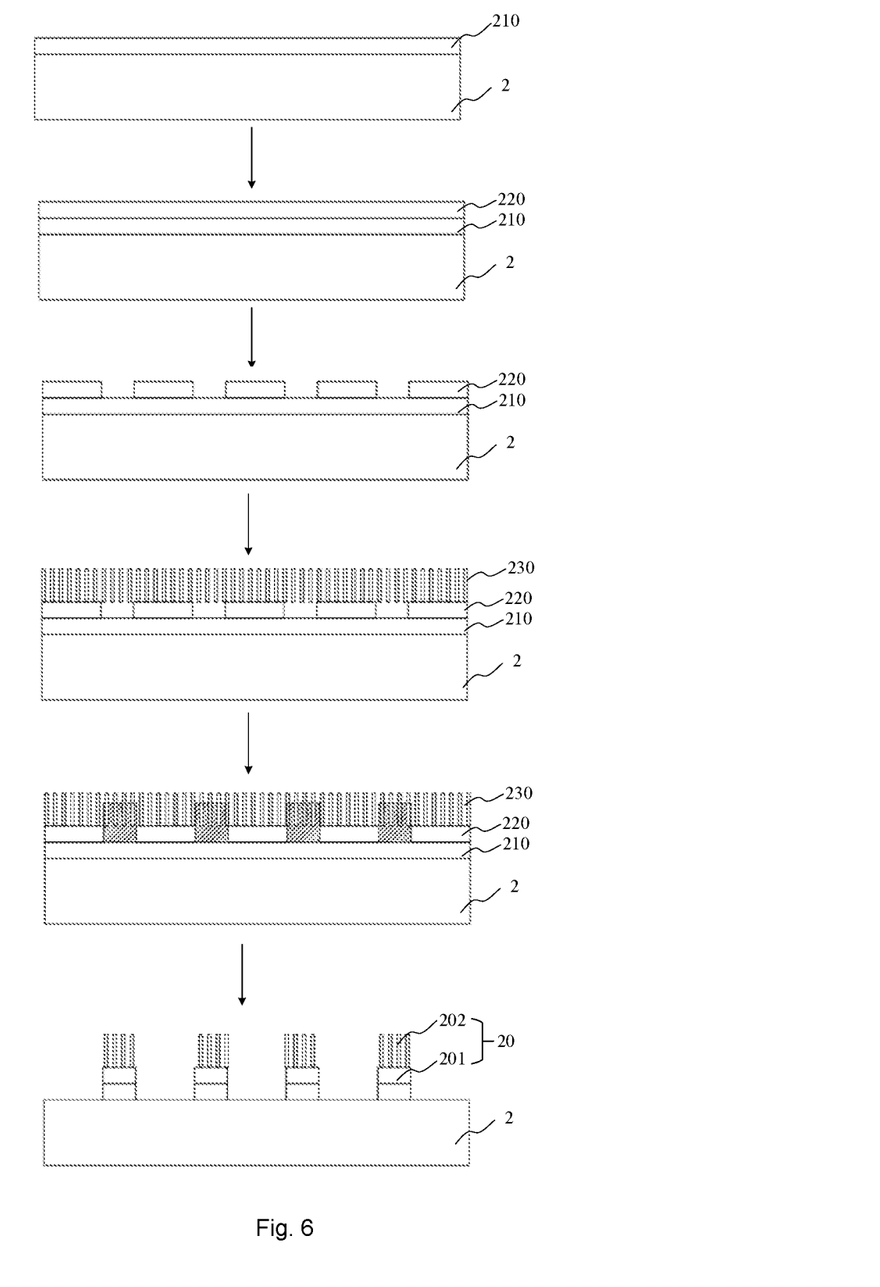
FIG. 6 is an illustrative structural schematic drawing of the step of forming a second metal micro-bump array on a second substrate according to an exemplary embodiment of the present disclosure.

FIG. 5 is a schematic flow chart of a step of forming a second metal micro-bump array on a second substrate according to an exemplary embodiment of the present disclosure; and FIG. 6 is an illustrative structural schematic drawing of the step of forming a second metal micro-bump array on a second substrate according to an exemplary embodiment of the present disclosure.

It could be understood that a mode similar to or substantially same as that for the first substrate 1 can be adopted to form the second metal micro-bump array 20 on the second substrate 2. Referring to FIGS. 5 and 6, in an optional embodiment, the step of forming a second metal micro-bump array 20 on the second substrate 2 may comprise: sputtering a second seed layer 210 on the second substrate 2; coating a second photoresist layer 220 on the second seed layer; patterning the second photoresist layer 220, and exposing the second photoresist layer 220 at a position where the second metal micro-bump array 202 is to be formed; hot-pressing a second porous membrane layer 230 on the second photoresist layer 220, wherein the second porous membrane layer 230 is constructed as a growth template for the second metal nanowires 202; forming the second metal pillar 201 and the second metal nanowires 202 on the second seed layer 210 by way of plating at a position where the second photoresist layer 220 is exposed, such that the growth height of the second metal nanowires 202 is lower than the height of the second porous membrane layer 230; and removing the second porous membrane layer 230, the second photoresist layer 220, and the exposed part of the second seed layer 210.

In some embodiments, the second porous membrane layer 230 may be a porous polycarbonate membrane layer or a porous anodized aluminum oxide membrane layer. In addition, in some embodiments, the step of removing the second porous membrane layer 230, the second photoresist layer 220, and the exposed part of the second seed layer 210 may comprise: immersing the second substrate 2 in a dichloromethane solution to dissolve the second porous membrane layer 230; immersing the second substrate 2 in an acetone solution to dissolve the second photoresist layer 220; and removing the exposed part of the second seed layer 210 by grinding.

According to the substrate bonding method provided in the embodiments of the present disclosure, a mode similar to or substantially same as that for the first substrate can be adopted to form the second metal micro-bump array on the second substrate, such that the manufacturing efficiency can be greatly improved. However, it shall be pointed out that the scope of the present disclosure is not limited thereto. A person skilled in the art could conceive of a mode differing from that of the first substrate for forming the second metal micro-bump array on the substrate, which does not depart from the spirit and the scope of the present disclosure.

In some embodiments, the substrate bonding method may further comprise: performing surface treatment on the first metal micro-bump array 10 and the second metal micro-bump array 20 prior to the heating reflux of the first metal micro-bump array 10 and the second metal micro-bump array 20. In this way, the quality of intermetallic compounds produced during the subsequent heating reflux can be improved.

In some embodiments, the step of performing surface treatment on the first metal micro-bump array 10 and the second metal micro-bump array 20 may comprise: applying a soldering flux to the surfaces of the first metal micro-bump array 10 and the second metal micro-bump array 20; and/or removing oxides on the surfaces of the first metal micro-bump array 10 and the second metal micro-bump array 20 by using formic acid reduction, hydrogen gas reduction, and plasma deoxidation.

It could be understood that according to the embodiments of the present disclosure, the surface treatment for the first metal micro-bump array and the second metal micro-bump array may occur in any proper phase of the substrate bonding method. In an optional embodiment, the substrate bonding method may further comprise: performing surface treatment on the first metal micro-bump array 10 and the second metal micro-bump array 20 prior to pressing the first substrate 1 onto the second substrate 2, so as to remove oxides on the surfaces of the first metal micro-bump array 10 and the second metal micro-bump array 20; and placing the first substrate 1 and the second substrate 2 in a vacuum environment, or placing the first substrate 1 and the second substrate 2 in an atmosphere environment capable of preventing the first metal micro-bump array 10 and the second metal micro-bump array 20 from being oxidized, while the first substrate 1 is being pressed towards the second substrate 2 and after the first substrate 1 is pressed onto the second substrate 2. In this way, it can be ensured that there is no any oxide on the surfaces of the first metal micro-bump array 10 and the second metal micro-bump array 20 during the subsequent heating reflux, hereby improving the quality of intermetallic compounds produced during the subsequent heating reflux.

In some embodiments, the first metal micro-bump array 10 and the second metal micro-bump array 20 may be subjected to heating flux within a temperature range between 100° C. and 300° C. In addition, in some embodiments, the filling material 3 may be cured within a temperature range between 100° C. and 300° C. It shall be pointed out that the temperature range for the heating reflux and the temperature range for curing the filling material mentioned in the present disclosure are not restrictive. Without departing from the scope and the spirit of the present disclosure, the temperature range for the heating reflux and/or the temperature range for curing the filling material may be changed in any proper manner.

In some embodiments, the first metal pillar 101 and the second metal pillar 102 may have a height ranging from 0.1 to 50 microns, and may have a diameter ranging from 0.5 to 200 microns. In some embodiments, the first metal nanowires 102 and the second metal nanowires 202 may have a height ranging from 0.1 to 50 microns, and may have a diameter ranging from 0.01 to 5 microns. It shall be pointed out that the dimensions of the first metal micro-bump array and the dimensions of the second metal micro-bump array mentioned in the present disclosure are also not restrictive. A person skilled in the art could conceive of a first metal micro-bump array 10 and a second metal micro-bump array 20 of any proper dimensions, as long as they can realize reliable bonding of the first substrate 1 and the second substrate 2.

In the context of the present disclosure, orientational terms such as "front", "rear", "left", "right", "upper", "lower", "far", and "near" are used merely for facilitating the description, and should not be deemed as restrictive. Although the present disclosure is described with reference to exemplary embodiments, it shall be understood that the present disclosure is not limited to the specific embodiments described and shown in detail herein. Without departing from the scope defined in the claims of the present disclosure, a person skilled in the art could make various modifications to the exemplary embodiments.

Features mentioned and/or shown in the above description of the exemplary embodiments of the present disclosure may be incorporated into one or more other embodiments in same or similar modes, be combined with features in other embodiments, or substitute corresponding features in other embodiments. These technical solutions obtained through combinations or substitutions shall also be deemed as being covered in the scope of protection of the present disclosure.

INDUSTRIAL APPLICABILITY

The present disclosure provides a substrate bonding method, wherein the substrate bonding method may comprise: providing a first substrate and a second substrate; forming a first metal micro-bump array on the first substrate, wherein the first metal micro-bump array comprises at least one first metal pillar formed on the first substrate and a plurality of first metal nanowires formed on the first metal pillar and spaced apart from each other; forming a second metal micro-bump array on the second substrate, wherein the second metal micro-bump array comprises at least one second metal pillar formed on the second substrate and a plurality of second metal nanowires formed on the second metal pillar and spaced apart from each other; pressing the first substrate onto the second substrate, such that the first metal micro-bump array and the second metal micro-bump array are positioned in a manner of being staggered with each other, hereby forming a physically interwoven interlocking structure between the first metal nanowires and the second metal nanowires; applying a filling material between the first substrate and the second substrate; curing the filling material to form a bonding cavity; and performing heating confinement reflux on the first metal micro-bump array and the second metal micro-bump array in the bonding cavity, after the filling material is cured, so as to realize bonding of the first substrate and the second substrate. According to the substrate bonding method provided in the present disclosure, the attach-pressing and interlocking of the first substrate and the second substrate are realized. During the attach-pressing and interlocking process, a physically interwoven interlocking structure is formed between the first metal nanowires and the second metal nanowires, hereby obtaining a relatively strong interlocking strength between the first substrate and the second substrate, and such an interlocking strength formed by physical interweaving makes sure that: no any displacement would be caused between an upper substrate and a lower substrate when adding a filling material. In addition, since the filling material cannot saturate the interlocking network formed by the interlocking structure, a bonding cavity will be formed after the filling material is cured, wherein the first metal micro-bump array and the second metal micro-bump will be enclosed in the bonding cavity. In this way, when the first metal micro-bump array and the second metal micro-bump array are subjected to heating reflux, because of the capillary effect, melted metal materials will only be able to flow in the bonding cavity in a confined manner, and cannot overflow. Therefore, possible risks of bonding short-circuit caused by overflowing metal materials are avoided. Moreover, during the liquidizing process of the metal materials of the first metal micro-bump array and the second metal micro-bump array, alignment bonding has the self-alignment effect, therefore, the alignment accuracy can be improved, the bonding reliability is improved, and the bonding temperature is reduced. Therefore, the present disclosure provides a novel interconnecting method for low-temperature bonding of metal micro-bumps by attach-pressing-interlocking-filling-refluxing.

In addition, it could be understood that the substrate bonding method provided in the present disclosure is reproduceable and can be adopted in various industrial applications. For example, the substrate bonding method provided in the present disclosure can be applied to the technical field of semiconductor packaging.

The invention claimed is:

1. A substrate bonding method, wherein the substrate bonding method comprises steps of:

providing a first substrate and a second substrate;

forming a first metal micro-bump array on the first substrate, wherein the first metal micro-bump array comprises at least one first metal pillar formed on the first substrate and a plurality of first metal nanowires formed on the first metal pillar and spaced apart from each other;

forming a second metal micro-bump array on the second substrate, wherein the second metal micro-bump array comprises at least one second metal pillar formed on the second substrate and a plurality of second metal nanowires formed on the second metal pillar and spaced apart from each other;

pressing the first substrate onto the second substrate, such that the first metal micro-bump array and the second metal micro-bump array are positioned in a manner of being staggered with each other, hereby forming a physically interwoven interlocking structure between the first metal nanowires and the second metal nanowires;

applying a filling material between the first substrate and the second substrate;

curing the filling material to form a bonding cavity; and performing heating confinement reflux on the first metal micro-bump array and the second metal micro-bump array in the bonding cavity, after the filling material is cured, so as to realize bonding of the first substrate and the second substrate.

2. The substrate bonding method according to claim 1, wherein the first metal micro-bump array and the second metal micro-bump array are made of at least one material selected from the group consisting of copper, tin, and indium; and the first metal micro-bump array is formed of a material same as or different from a material which the second metal micro-bump array is formed of.

3. The substrate bonding method according to claim 2, wherein the step of applying a filling material between the first substrate and the second substrate comprises:

applying the filling material into an interspace formed between the first substrate and the second substrate, after the first substrate is pressed onto the second substrate.

4. The substrate bonding method according to claim 2, wherein the filling material is applied onto the second substrate prior to pressing the first substrate onto the second substrate; and the filling material is filled in an interspace between the first substrate and the second substrate by pressing the first substrate onto the second substrate.

5. The substrate bonding method according to claim 2, wherein the step of forming a first metal micro-bump array on the first substrate comprises:

sputtering a first seed layer on the first substrate;

coating a first photoresist layer on the first seed layer;

patterning the first photoresist layer, and exposing the first photoresist layer at a position where the first metal micro-bump array is to be formed;

hot-pressing a first porous membrane layer on the first photoresist layer, wherein the first porous membrane layer is configured to be used as a growth template for the first metal nanowires;

forming the first metal pillar and the first metal nanowires on the first seed layer by way of plating, at a position where the first photoresist layer is exposed, such that a growth height of the first metal nanowires is lower than a height of the first porous membrane layer; and removing the first porous membrane layer, the first photoresist layer, and an exposed part of the first seed layer, after the first metal pillar and the first metal nanowires are formed.

6. The substrate bonding method according to claim 2, wherein the step of forming a second metal micro-bump array on the second substrate comprises:

sputtering a second seed layer on the second substrate;

coating a second photoresist layer on the second seed layer;

patterning the second photoresist layer, and exposing the second photoresist layer at a position where the second metal micro-bump array is to be formed;

hot-pressing a second porous membrane layer on the second photoresist layer, wherein the second porous membrane layer is configured to be used as a growth template for the second metal nanowires;

forming the second metal pillar and the second metal nanowires on the second seed layer by way of plating, at a position where the second photoresist layer is exposed, such that a growth height of the second metal nanowires is lower than a height of the second porous membrane layer; and removing the second porous membrane layer, the second photoresist layer, and an exposed part of the second seed layer.

7. The substrate bonding method according to claim 2, wherein the substrate bonding method further comprises:

performing surface treatment on the first metal micro-bump array and the second metal micro-bump array prior to pressing the first substrate onto the second substrate, so as to remove oxides on surfaces of the first metal micro-bump array and the second metal micro-bump array; and placing the first substrate and the second substrate in a vacuum environment, or placing the first substrate and the second substrate in an atmosphere environment capable of preventing the first metal micro-bump array and the second metal micro-bump array from being oxidized, while the first substrate is being pressed towards the second substrate and after the first substrate is pressed onto the second substrate.

8. The substrate bonding method according to claim 1, wherein the step of applying a filling material between the first substrate and the second substrate comprises:

applying the filling material into an interspace formed between the first substrate and the second substrate, after the first substrate is pressed onto the second substrate.

9. The substrate bonding method according to claim 1, wherein the filling material is applied onto the second substrate prior to pressing the first substrate onto the second substrate; and the filling material is filled in an interspace between the first substrate and the second substrate by pressing the first substrate onto the second substrate.

10. The substrate bonding method according to claim 1, wherein the step of forming a first metal micro-bump array on the first substrate comprises:

sputtering a first seed layer on the first substrate;

coating a first photoresist layer on the first seed layer;

patterning the first photoresist layer, and exposing the first photoresist layer at a position where the first metal micro-bump array is to be formed;

hot-pressing a first porous membrane layer on the first photoresist layer, wherein the first porous membrane layer is configured to be used as a growth template for the first metal nanowires;

forming the first metal pillar and the first metal nanowires on the first seed layer by way of plating, at a position where the first photoresist layer is exposed, such that a growth height of the first metal nanowires is lower than a height of the first porous membrane layer; and removing the first porous membrane layer, the first photoresist layer, and an exposed part of the first seed layer, after the first metal pillar and the first metal nanowires are formed.

11. The substrate bonding method according to claim 10, wherein the first porous membrane layer is a porous polycarbonate membrane layer or a porous anodized aluminum oxide membrane layer; and the step of removing the first porous membrane layer, the first photoresist layer, and an exposed part of the first seed layer comprises:
  immersing the first substrate in a dichloromethane solution to dissolve the first porous membrane layer;
  immersing the first substrate in an acetone solution to dissolve the first photoresist layer; and
  removing the exposed part of the first seed layer by grinding.

12. The substrate bonding method according to claim 1, wherein the step of forming a second metal micro-bump array on the second substrate comprises:
  sputtering a second seed layer on the second substrate;
  coating a second photoresist layer on the second seed layer;
  patterning the second photoresist layer, and exposing the second photoresist layer at a position where the second metal micro-bump array is to be formed;
  hot-pressing a second porous membrane layer on the second photoresist layer, wherein the second porous membrane layer is configured to be used as a growth template for the second metal nanowires;
  forming the second metal pillar and the second metal nanowires on the second seed layer by way of plating, at a position where the second photoresist layer is exposed, such that a growth height of the second metal nanowires is lower than a height of the second porous membrane layer; and
  removing the second porous membrane layer, the second photoresist layer, and an exposed part of the second seed layer.

13. The substrate bonding method according to claim 12, wherein the second porous membrane layer is a porous polycarbonate membrane layer or a porous anodized aluminum oxide membrane layer; and
  the step of removing the second porous membrane layer, the second photoresist layer, and an exposed part of the second seed layer comprises:
  immersing the second substrate in a dichloromethane solution to dissolve the second porous membrane layer;
  immersing the second substrate in an acetone solution to dissolve the second photoresist layer; and
  removing the exposed part of the second seed layer by grinding.

14. The substrate bonding method according to claim 1, wherein the substrate bonding method further comprises:
  performing surface treatment on the first metal micro-bump array and the second metal micro-bump array prior to performing heating reflux on the first metal micro-bump array and the second metal micro-bump array.

15. The substrate bonding method according to claim 14, wherein the step of performing surface treatment on the first metal micro-bump array and the second metal micro-bump array comprises:
  applying a soldering flux to surfaces of the first metal micro-bump array and the second metal micro-bump array; and/or
  removing oxides on the surfaces of the first metal micro-bump array and the second metal micro-bump array by using formic acid reduction, hydrogen gas reduction, and plasma deoxidation.

16. The substrate bonding method according to claim 1, wherein the substrate bonding method further comprises:
  performing surface treatment on the first metal micro-bump array and the second metal micro-bump array prior to pressing the first substrate onto the second substrate, so as to remove oxides on surfaces of the first metal micro-bump array and the second metal micro-bump array; and
  placing the first substrate and the second substrate in a vacuum environment, or placing the first substrate and the second substrate in an atmosphere environment capable of preventing the first metal micro-bump array and the second metal micro-bump array from being oxidized, while the first substrate is being pressed towards the second substrate and after the first substrate is pressed onto the second substrate.

17. The substrate bonding method according to claim 1, wherein the filling material is an epoxy resin.

18. The substrate bonding method according to claim 1, wherein the filling material is cured within a temperature range between 100° C. and 300° C.

19. The substrate bonding method according to claim 1, wherein the first metal micro-bump array and the second metal micro-bump array are subjected to heating flux within a temperature range between 100° C. and 300° C.

20. The substrate bonding method according to claim 1, wherein
  each of the first metal pillar and the second metal pillar has a height ranging from 0.1 to 50 microns, and a diameter ranging from 0.5 to 200 microns; and
  each of the first metal nanowires and the second metal nanowires has a height ranging from 0.1 to 50 microns, and a diameter ranging from 0.01 to 5 microns.

* * * * *